(12) United States Patent
Yang et al.

(10) Patent No.: US 8,376,031 B2
(45) Date of Patent: Feb. 19, 2013

(54) BLOWERLESS HEAT EXCHANGER BASED ON MICRO-JET ENTRAINMENT

(75) Inventors: Wei Yang, Minnetonka, MN (US); Chunbo Zhang, Plymouth, MN (US); Steven J Eickhoff, Brooklyn Park, MN (US); Alex Gu, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 1239 days.

(21) Appl. No.: 12/181,480

(22) Filed: Jul. 29, 2008

(65) Prior Publication Data

US 2009/0288807 A1 Nov. 26, 2009

Related U.S. Application Data

(60) Provisional application No. 61/054,544, filed on May 20, 2008.

(51) Int. Cl.
*F28F 7/00* (2006.01)
*H05K 7/20* (2006.01)
(52) U.S. Cl. .................. 165/80.3; 165/104.34
(58) Field of Classification Search ................. 165/80.3, 165/908, 104.34, 104.32, 121; 361/690, 361/691, 692, 695
See application file for complete search history.

(56) References Cited

U.S. PATENT DOCUMENTS

| | | | |
|---|---|---|---|
| 4,296,455 A * | 10/1981 | Leaycraft et al. | 361/691 |
| 4,417,295 A * | 11/1983 | Stuckert | 361/694 |
| 4,800,956 A | 1/1989 | Hamburgen | 165/185 |
| 4,851,965 A * | 7/1989 | Gabuzda et al. | 361/691 |
| 5,361,188 A * | 11/1994 | Kondou et al. | 361/695 |
| 5,428,503 A * | 6/1995 | Matsushima et al. | 361/695 |
| 5,731,954 A | 3/1998 | Cheon | 361/699 |
| 6,352,103 B1 | 3/2002 | Chu et al. | 165/80.3 |
| 6,373,696 B1 | 4/2002 | Bolognia et al. | 361/687 |
| 6,378,605 B1 * | 4/2002 | Kutscher et al. | 165/181 |
| 6,538,885 B1 * | 3/2003 | Azar | 361/695 |
| 6,538,892 B2 | 3/2003 | Smalc | 361/710 |
| 6,587,336 B2 | 7/2003 | Chu et al. | 361/687 |
| 6,684,942 B2 * | 2/2004 | Song et al. | 165/122 |
| 6,765,796 B2 * | 7/2004 | Hoffman et al. | 361/695 |
| 6,781,834 B2 * | 8/2004 | Nair et al. | 361/697 |
| 6,817,405 B2 * | 11/2004 | Kamath et al. | 165/80.3 |
| 6,886,249 B2 | 5/2005 | Smalc | 29/890.03 |
| 6,918,438 B2 | 7/2005 | Ellsworth, Jr. et al. | 165/185 |
| 7,000,427 B2 | 2/2006 | Mathias et al. | 62/612 |
| 7,222,423 B2 | 5/2007 | Ellsworth, Jr. et al. | 29/890.039 |
| 7,284,596 B2 * | 10/2007 | Larson | 165/80.3 |
| 2002/0069661 A1 * | 6/2002 | Livni | 62/259.2 |

* cited by examiner

*Primary Examiner* — Tho V Duong
(74) *Attorney, Agent, or Firm* — Shumaker & Sieffert, P.A.

(57) ABSTRACT

A blowerless heat exchanger apparatus based on micro-jet entrainment is disclosed. The heat exchanger apparatus incorporates a number of fins regularly spaced apart from each other and parallel to each other, thus letting air currents flow in the space defined between them. A dense array of micro-jet nozzles can be fabricated on the fins surface pointing to the flow direction of the air movement in order to induce increase airflow. The air from an air compressor delivers sufficient airflow on the fins surface utilizing micro-jets entrainment. The micro-jet entrainment confirms strong turbulent around the micro-jets and suggests significant heat transfer enhancement. The turbulence from the micro-jets enhance the heat transfer coefficient, potentially by an order of magnitude, therefore allowing much larger fin spacing and leads to huge reduction of flow resistance and overall power consumption.

19 Claims, 3 Drawing Sheets

BLOWERLESS HEAT EXCHANGER BASED ON MICRO-JET ENTRAINMENT

CROSS REFERENCE TO PROVISIONAL PATENT APPLICATION

This patent application claims priority to U.S. Provisional Patent Application Ser. No. 61/054,544, entitled "Blowerless Heat Exchanger Based on Micro-Jet Entrainment," which was filed on May 20, 2008, the disclosure of which is incorporated herein by reference in its entirety.

TECHNICAL FIELD

Embodiments are generally related to heat exchangers. Embodiments are also related to MEMS (Microelectromechanical Systems) and, more particularly, to MEMS-based structures, components and devices. Embodiments are additionally related to heat exchangers based on micro-jet entrainment.

BACKGROUND OF THE INVENTION

Electronic cooling has been a major impediment for system size reduction and often dictates external dimensions and form factors for computers and other equipments. Electronic systems are generally provided with a large number of heat-generating components such as, for example, microprocessors, power amplifiers, radio frequency (RF) devices and high-power lasers. The functional integrity of such electronic components can be maintained by keeping the temperature of these components below a predetermined value.

An air cooled heat exchanger can be utilized for efficient heat transfer from heat-generating components to ambient air. Conventional heat exchangers rely on an external air-moving component such as, for example, a blower or a fan, to provide airflow for convective heat transfer. For example, the heat exchanger for a CPU (Central Processing Unit) cooling in a desktop computer includes the use of a finned heatsink and a fan. A problem associated with such heat exchangers is the poor heat transfer from the fins surface to the laminar air stream and low efficiency of external air moving units such as blowers or fans. As such, they are very inefficient in terms of the amount of heat removal per unit power consumption, known as a coefficient of performance (COP), which may be typically lower than ten. Such low efficiency, or COP, often results in heavy, bulky, and noisy thermal management systems.

In one prior art implementation, a large total fin area is needed to achieve sufficient fin-air heat transfer and low thermal resistance. However, for a given heatsink size, the large fin area requires a dense placement of the fins which leads to a higher pressure drop and a higher power consumption by the blowers or the fans. Commercially available blowers and fans for electronic cooling, particularly in the high pressure regime, have low efficiencies, typically converting less than 20% of the electrical energy to air pressure while the majority to turbulence. The turbulence in the external blowers or fans is quickly dissipated into heat long before it enters the fin channels to perform any useful work, which therefore is wasted. In addition, the overall size of the heat exchangers is significantly increased due to the size of the external blowers or fans.

Based on the foregoing it is believed that a need exists for an improved heat exchanger that can be adapted for enhanced heat transfer applications in electronic components based on micro-jet entrainment as described in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved heat exchanger.

It is a further aspect of the present invention to provide an improved heat exchanger based on micro-jet entrainment for enhanced heat transfer in electronic components.

The aforementioned aspects and other objectives and advantages can now be achieved as described herein. A blowerless heat exchanger apparatus based on micro-jet entrainment is disclosed. The heat exchanger apparatus incorporates a number of fins regularly spaced apart from each other and parallel to each other, thereby permitting airflow in a space defined therebetween. A dense array of micro-jet nozzles can be fabricated on the surface of the fins and pointing to the flow direction of the air movement in order to induce entrainment airflow. The air from an air compressor or other pressurized air sources can be utilized to deliver the primary airflow to the micro nozzles thereby creating the micro-jets with exit velocities from 100 m/s to 400 m/s. As the jets interact with the surrounding air, the momentum of the jets is transferred to a much larger air mass, resulting in the movement of the larger air mass at a slower speed (e.g. 1 m/s to 20 m/s), known as the secondary flow, which serves to carry heat away from the heatsink. In addition to the air movement, micro-jet entrainment induces strong turbulence on the fin surface, which significantly enhances heat transfer from the fin surface to the air. Thereby the entrainment heatsink could achieve low thermal resistance with less fin surface area, enabling designs that use a much larger fin spacing which leads to substantial reduction in flow resistance and overall power consumption.

The micro-jet nozzle further includes a tapered nozzle with an opening that can induce the secondary airflows, for example, in the range of 10 to 60 times of the primary flow by entrainment. Silicon-based fin structure with micro-jet nozzles can be fabricated on a silicon substrate utilizing MEMS technology. Metal-based fin structure with micro-jet nozzles can be fabricated on a stamped metal foil soldered to a metal core and micro nozzles fabricated utilizing laser micromachining process. The heat exchanger apparatus disclosed herein utilizes the air compressor to supply air to the micro-jets, which significantly reduces the size.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
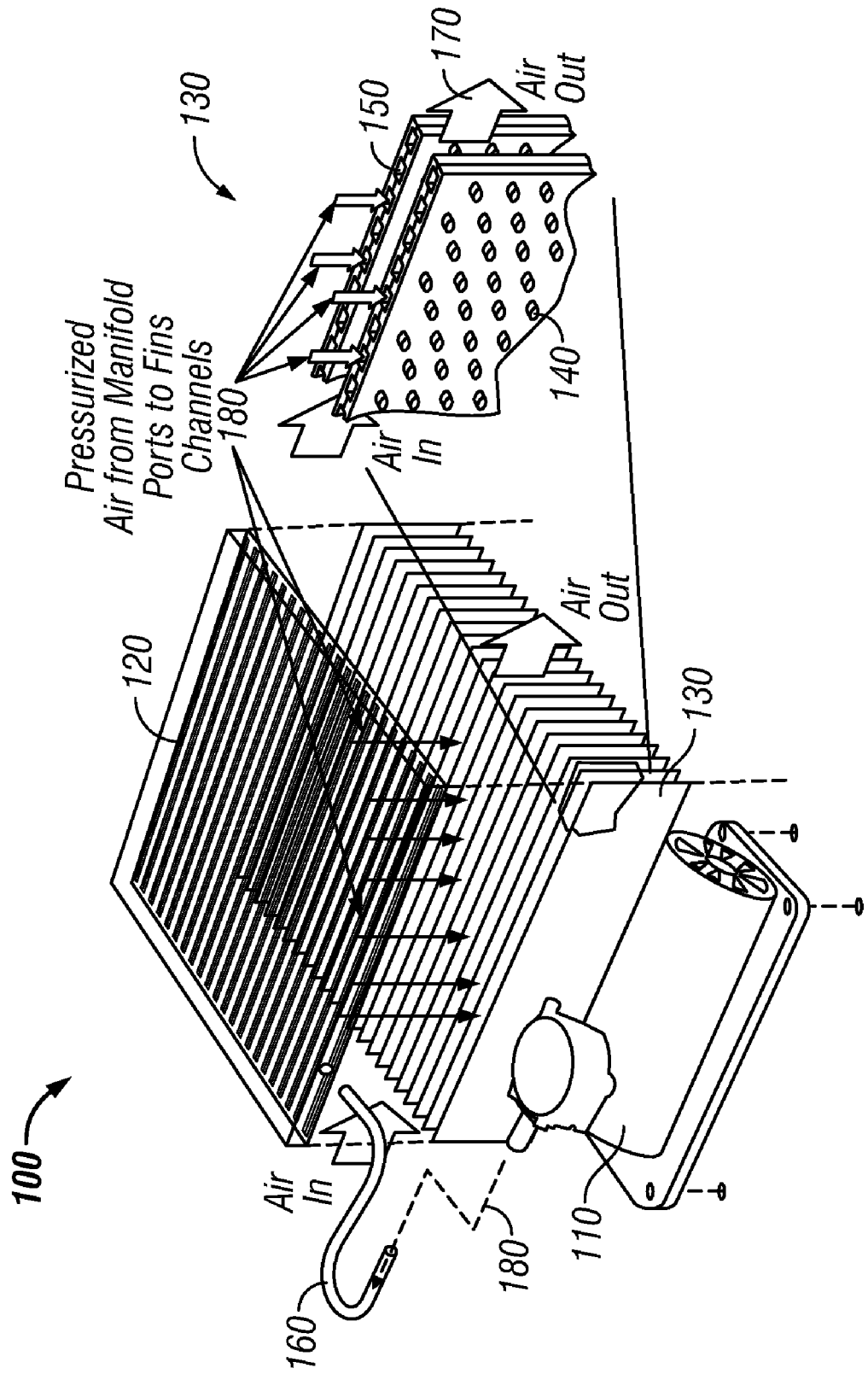
FIG. 1 illustrates an overall configuration of the heat exchanger, in accordance with a preferred embodiment.

FIG. 1 illustrates an overall configuration including the main components of a heat exchanger apparatus 100, in accordance with a preferred embodiment. Apparatus 100 constitutes a blowerless heat exchanger. The apparatus 100 generally includes an air compressor 110, an air manifold 120, a number of fins 130 having a dense array of micro nozzles 140 and air delivery channels 150. The micro nozzles 140 can be fabricated in dense arrays on the surface of the fins 130, pointing to the flow direction and can induce airflow 170 by entrainment. The compressed air 180 from the compressor 110 can be passed to the manifold 120 via an air hose 160. The manifold 120 is in fluidic connection with the micro nozzles 140 via air channels 150. Therefore, the compressed air can be uniformly distributed to the micro nozzles and create micro-jets for air entrainment.

The fins 130 can be regularly spaced apart from and parallel to each other, thereby permitting air currents to flow in the space-defined therebetween. The air compressor 110 can be utilized for delivering sufficient primary airflow 180 to the micro nozzles 140. The induced airflow 170 exits the heat exchanger can be 10 to 100 times larger than the primary flow 180, which carries heat away from the apparatus 100.

Figure 2:
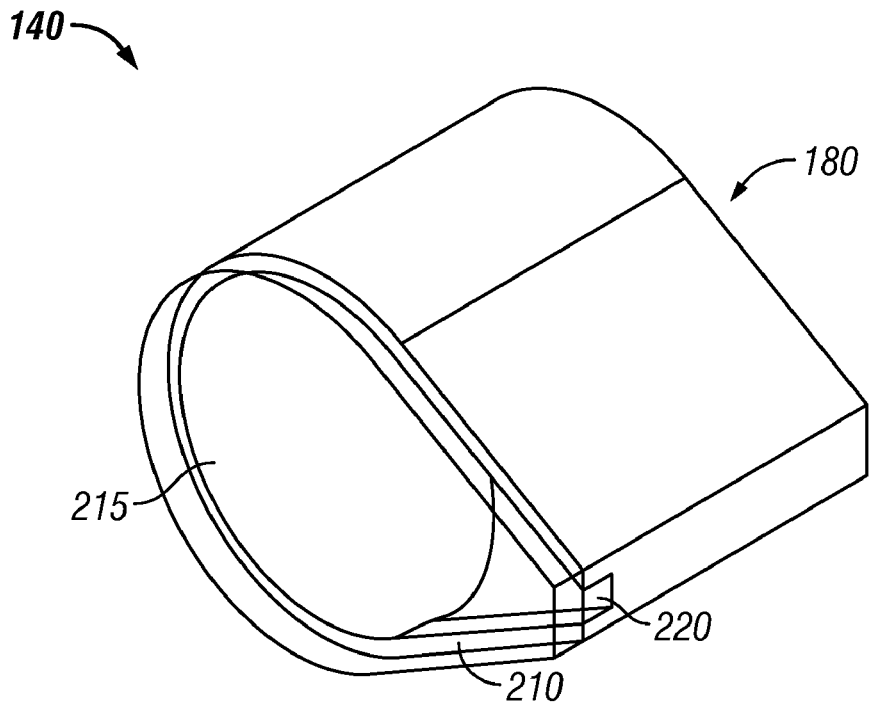
FIG. 2 illustrates a perspective view of a pair of fins with a dense array of micro-jet nozzles, which can be implemented in accordance with a preferred embodiment.

FIG. 2 illustrates a perspective view of an on-fin micro-jet nozzle 140, in accordance with the preferred embodiment. The micro-jet nozzle 140 includes a tapered end section 210, a top cap 215 and an opening 220. The compressed air 180 enters from the base of the nozzle and exits from the opening 220 at jet speed from 100 m/s to 400 m/s. The micro-jet nozzle 140 can possess in some scenarios, a 100 μm vertical height from the fin surface and, for example, a 20 μm×20 μm opening 220. It can be appreciated, of course, that such parameters are merely suggested dimensions and that many other dimensions and sizes are possible.

Figure 3:
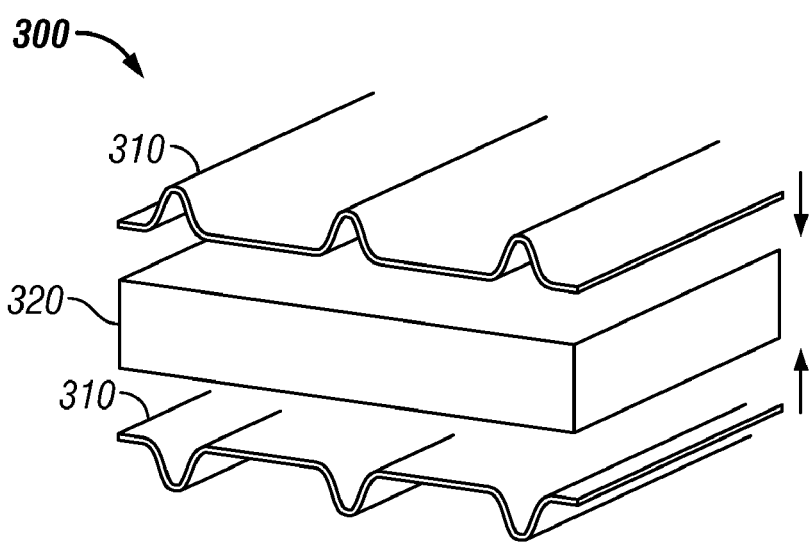
FIGS. 3-5 illustrate a process for fabricating metal-based fin structure with micro-jet nozzles, in accordance with an alternative embodiment.
Figure 4:
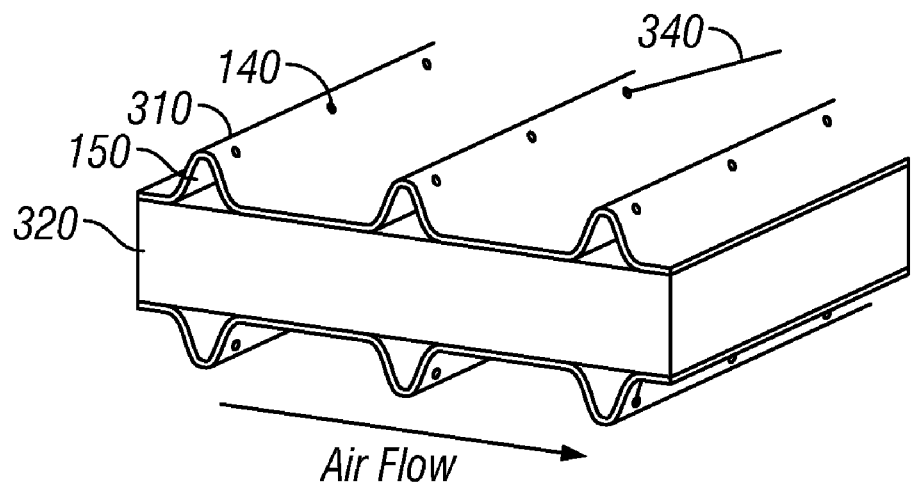
Figure 5:
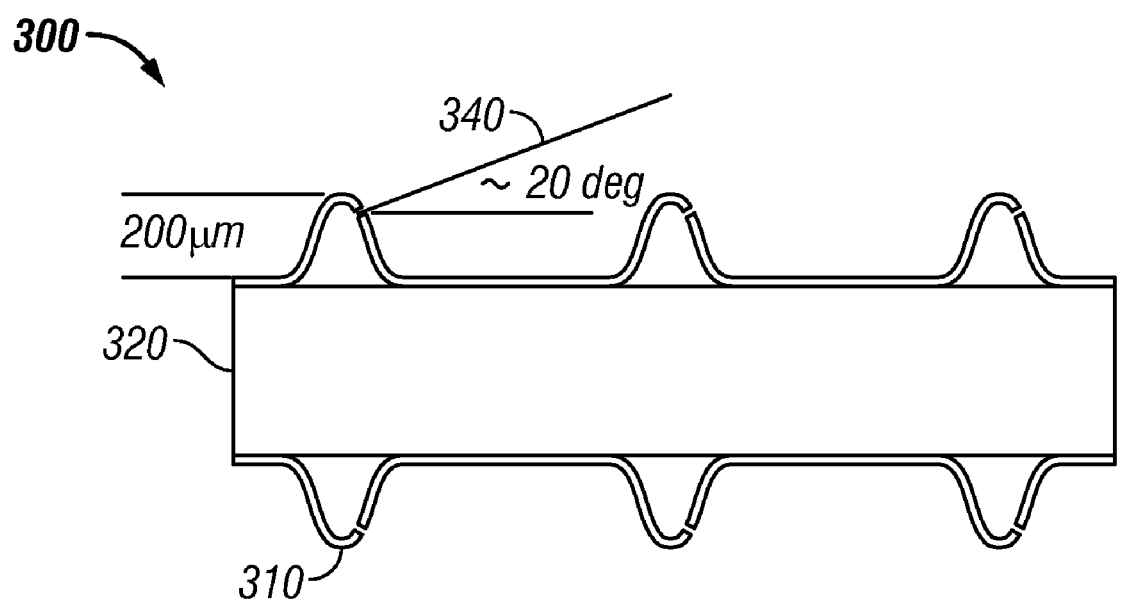

FIGS. 3-5 together illustrate a process 300 for fabricating a metal-based fin structure with micro-jet nozzles 140 and air channels 150, in accordance with an alternative embodiment. Note that in FIGS. 3-5, identical or similar blocks are generally indicated by identical reference numerals. A pair of metal foils 310 (e.g., approximately 200 μm thick) can be stamped to form ridges, as shown in FIG. 3. The stamped metal foils 310 can be bonded to a metal core 320 by soldering, brazing, or welding. Air channels 150 are formed between the ridges and the metal core. Holes (e.g., approximately 10~30 μm) can be micro machined on the ridges of the stamped metal foil 310 utilizing a laser beam 340 (e.g., at approximately 20 deg angle from the flow direction), in order to form micro-jet nozzles 140, as illustrated in FIG. 4-5. It can be appreciated that the stamped metal foils 310 are compatible with the laser machining process. These dimensions are described for purposes of clarity and specificity; however, they should not be interpreted in any limiting manner. FIG. 5 illustrates a cross-sectional view of the metal-based fin structure 300 with micro-jet nozzles 140.

The heat exchanger apparatus 100 can be utilized in a broad area of applications, particularly in electronics cooling where compactness and performance are desired. The turbulence from the micro-jets 140 enhance the heat transfer coefficient, potentially by an order of magnitude, therefore allowing much larger fin spacing and leads to huge reduction of flow resistance and overall power consumption. The heat exchanger apparatus 100 utilizes the air compressor 110 to supply air to the micro-jets 140. As a low-flow high-pressure compressor is typically smaller than a high-flow low-pressure fan or blower at the same power level, significant size reduction can be expected. The air compressor may be a small and efficient displacement pump or a turbo pump.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A blowerless heat exchanger apparatus, comprising:
a plurality of fins spaced apart from each other, each fin of the plurality of fins defining a plurality of micro-jet nozzles on a surface of the respective fin, wherein the plurality of micro-jet nozzles point to an air flow direction in order to directly propel air by entrainment;
a plurality of air channels embedded in the plurality of fins, at least one air channel of the plurality of air channels being in fluidic connection with at least one micro-jet nozzle of the plurality of micro-jet nozzles; and
an air compressor configured to provide compressed air to the plurality of micro-jet nozzles, wherein the plurality of micro-jet nozzles are configured to induce entrainment flow and turbulence to enhance a heat transfer coefficient of the heat exchanger apparatus,
wherein a first mass flow rate from the air compressor is smaller than a second mass flow rate of the entrainment flow.

2. The apparatus of claim 1, further comprising a manifold in fluidic connection with the plurality of air channels and the air compressor.

3. The apparatus of claim 1, wherein each micro-jet nozzle of the plurality of micro-jet nozzles comprises a tapered section and an opening configured to facilitate air entrainment.

4. The apparatus of claim 1, wherein each fin of the plurality of fins comprises a metal fin or a silicon fin.

5. The apparatus of claim 1, wherein the plurality of fins comprises a plurality of metal fins fabricated with the plurality of micro-jet nozzles utilizing laser micromachining process on a stamped metal foil bonded to a metal core.

6. A method comprising:
providing compressed air via an air compressor to a plurality of micro-jet nozzles of a blowerless heat exchanger apparatus, the blowerless heat exchanger apparatus comprising a plurality of fins spaced apart from each other, each fin of the plurality of fins defining a plurality of micro-jet nozzles on a surface of the respective fin, wherein the plurality of micro-jet nozzles point to an air flow direction in order to directly propel air by entrainment, each fin of the plurality of fins comprising an air channel, wherein at least one air channel of the plurality of air channels is in fluidic connection with at least one micro-jet nozzle of the plurality of micro-jet nozzles,
wherein the plurality of micro-jet nozzles are configured to induce entrainment flow and turbulence to enhance a heat transfer coefficient of the heat exchanger apparatus, and wherein a first mass flow rate from the air compressor is smaller than a second mass flow rate of the entrainment flow.

7. The method of claim 6, wherein providing the compressed air via the air compressor to the plurality of micro-jet nozzles comprises passing the compressed air from the compressor to a manifold in fluidic connection with the plurality of air channels and the air compressor.

8. The method of claim 6, wherein each micro-jet nozzle of the plurality of micro-jet nozzles comprises a tapered section and an opening configured to facilitate air entrainment.

9. The method of claim 6, wherein each fin of the plurality of fins comprises a metal fin or a silicon fin.

10. The method of claim 6, wherein the plurality of fins comprises a plurality of silicon fins, the method further comprising fabricating the plurality of silicon fins with the plurality of micro-jet nozzles utilizing microelectromechanical systems (MEMS) technology on a silicon substrate.

11. The method of claim 6, wherein the plurality of fins comprises a plurality of metal fins, the method further comprising fabricating the plurality of metal fins with the plurality of micro-jet nozzles utilizing laser micromachining process on a stamped metal foil bonded to a metal core.

12. A blowerless heat exchanger apparatus, comprising:
a plurality of fins spaced apart from each other, each fin of the plurality of fins including:
a plurality of micro-jet nozzles on a surface of the respective fin, wherein the plurality of micro-jet nozzles are arranged in a plurality of rows and columns on the surface of the fin, and wherein the plurality of micro-jet nozzles point to an air flow direction in order to directly propel air by entrainment; and
an air channel in fluidic connection with at least one micro-jet nozzle of the plurality of micro-jet nozzles; and
an air compressor configured to provide compressed air to the plurality of micro-jet nozzles, wherein the plurality of micro-jet nozzles are configured to induce entrainment flow and turbulence to enhance a heat transfer coefficient of the plurality of fins, wherein a first mass flow rate from the air compressor is smaller than a second mass flow rate of the entrainment flow.

13. The apparatus of claim 12, wherein each micro-jet nozzle of the plurality of micro-jet nozzles comprises a tapered section and an opening configured to facilitate air entrainment.

14. The apparatus of claim 1, wherein each fin of the plurality of fins comprises:
a metal core; and
a metal foil bonded to the metal core and defining a plurality of ridges, wherein one or more air channels of the plurality of air channels are defined between the metal core and the ridges of the metal foil.

15. The apparatus of claim 14, wherein the plurality of ridges define the Micro-jet nozzles.

16. The apparatus of claim 1, wherein air exiting each micro-jet nozzle of the plurality of micro-jet nozzles in the air flow direction exits at a speed in a range of 100 meters per second to 400 meters per second.

17. The apparatus of claim 1, wherein air exiting the apparatus by entrainment generates a secondary air flow having a speed in a range of 1 meters per second to 20 meters per second.

18. The apparatus of claim 1, wherein air exiting the apparatus by entrainment exits at 10 times to 60 times a speed of the compressed air provided by the compressor.

19. The apparatus of claim 1, wherein the entrainment flow is 10 to 100 times larger than the compressed air provided by the air compressor.

* * * * *

UNITED STATES PATENT AND TRADEMARK OFFICE
CERTIFICATE OF CORRECTION

PATENT NO. : 8,376,031 B2
APPLICATION NO. : 12/181480
DATED : February 19, 2013
INVENTOR(S) : Wei Yang et al.

It is certified that error appears in the above-identified patent and that said Letters Patent is hereby corrected as shown below:

In the Specification

Col. 1, line 12, insert the following header and paragraph:

--STATEMENT REGARDING FEDERALLY SPONSORED RESEARCH OR DEVELOPMENT

This invention was made with Government support under W31P4Q-09-C-0042 awarded by the U.S. Army Contracting Command (AMCOM). The Government has certain rights in the invention.--

Signed and Sealed this
Fourth Day of June, 2013

Teresa Stanek Rea
*Acting Director of the United States Patent and Trademark Office*